United States Patent [19]

Sasaki

[11] Patent Number: 4,768,172
[45] Date of Patent: Aug. 30, 1988

[54] MEMORY CELL

[75] Inventor: Tooru Sasaki, Kawasaki, Japan

[73] Assignee: Kabushiki Kaisha Toshiba, Kawasaki, Japan

[21] Appl. No.: 945,568

[22] Filed: Dec. 23, 1986

[30] Foreign Application Priority Data

Jan. 21, 1986 [JP] Japan ................. 61-008830

[51] Int. Cl.[4] ............................................. G11C 13/00
[52] U.S. Cl. .................................. 365/230; 365/154; 365/189
[58] Field of Search .................. 365/154, 189, 230

[56] References Cited
U.S. PATENT DOCUMENTS 4,661,928 4/1987 Yasuoka ................. 365/189

OTHER PUBLICATIONS

CICC, 1982 (pp. 311-314); Stephen Glen Bowers. Takada et al., "RAM Buried Gate Array" (SSD84-59), published by Electron Communication Society of Japan, 1984, pp. 23-29.

Primary Examiner—Terrell W. Fears
Attorney, Agent, or Firm—Foley & Lardner, Schwartz, Jeffery, Schwaab, Mack, Blumenthal & Evans

[57] ABSTRACT

A memory cell comprises a memory which memorizes binary information in a static manner, a first delivery device which gives the binary information to a first bit line based on the potential of a first word line, and a second delivery device which gives the binary information memorized in the memory to a second word line different from the first word line, without forming a current path between the memory and a second bit line different from the first bit line.

13 Claims, 3 Drawing Sheets

MEMORY CELL

BACKGROUND OF THE INVENTION

1. Field of the Invention

The present invention relates to a static memory, and more particularly to a memory cell which uses a semiconductor memory device that has a multi-port function.

2. Description of the Prior Art

With a recent advancement in the semiconductor technology, there have been developed semiconductor memory devices that possess various functions. For instance, there exists a memory device which, having the so-called multi-port memory cell connected to a plurality of word lines and data lines, can carry out the read or write operation for a plurality of memory cells independently of each other and in parallel. The usefulness of the multi-port memory device is being appreciated increasingly as the memory device for the microcomputers that are being employed extensively for a wide range of purposes, for improving the performance of the microcomputers.

In FIG. 1 is shown a circuit diagram for one bit portion of a memory cell of a 2-port memory device. The writing operation in the memory cell is carried out by memorizing a high or low level voltage information that is given to the respective bit lines BL1 and $\overline{BL1}$, and an inverted low or high level voltage information that has logic which is the inverse of that of said voltage information, in a bistable circuit 9 which consists of inverters 5 and 7 that have their mutual input-output terminals connected via transfer gates 1 and 3 whose conduction is controlled by the potential of a word line WL1. In addition, writing is carried out also by memorizing a voltage information and an inverted voltage information that are given respectively to bit lines BL2 and $\overline{BL2}$, in the bistable circuit 9 via transfer gates 11 and 13 whose conduction is controlled by the potential of a word line WL2.

Further, the reading operation of the memory cell is carried out by delivering a voltage information and an inverted voltage information that are memorized in the bistable circuit 9 to the bit lines BL1 and $\overline{BL1}$ via the transfer gates 1 and 3. Or, the reading is carried out by delivering a voltage information and an inverted voltage information that are memorized in the bistable circuit 9 to the bit lines BL2 and $\overline{BL2}$ via the transfer gates 11 and 13.

In this way, the writing operation or the reading operation can be carried out in parallel and independently for two arbitrary memory cells that are arranged in matrix-form, by connecting two word lines and four bit lines to one memory cell. In a memory cell with such a configuration, however, there are required two pairs of bit lines which results in an increase in the occupied area of the memory cell to that of the memory device as a whole, becoming an obstruction to the attempt to increase the degree of integration.

The memory cell shown in FIG. 2 is one in which the memory cell is designed to function as a 3-port device (one write only port and two read only ports) with three bit lines, by decreasing the number of bit lines in FIG. 1 by one.

In this memory cell, reading operation is carried out by delivering the voltage information memorized in the bistable circuit 9 to the bit line BL2 via the transfer gate 15 whose conduction is controlled by the potential of the word line WL2, or by delivering the voltage information to the bit line BL3 via the transfer gate 17 whose conduction is controlled by the potential of the word line WL3. In addition, reading operation of the memory cell is designed to be carried out by using just one bit line BL1.

In order for the bistable circuit 9 to accurately memorize voltage information using a single bit line BL1, it is necessary to assign a larger driving capability to the inverter circuit 19 than that of the inverter circuit 21 that form together the bistable circuit 9. For this reason, the determination of the ratios of the inverter circuit 19 and the inverter circuit 21 to the transfer gate 1 is difficult to achieve which leads to a complication in the memory cell design. In addition, since the inverter circuit 19 and the inverter circuit 21 are asymmetric, the occupied area of the memory cell, for which is required the highest degree of integration in the memory device, is increased. Also, there is the necessity of preparing the word lines and the bit line for exclusive in reading and writing. Again it can be seen that it is not easy in such a memory cell configuration to increase the degree of integration.

The memory cell shown in FIG. 3 is designed to give an equal size to the inverter circuits 23 and 25 that constitute the bistable circuit 9, in contrast to the memory cell in FIG. 2, and the writing operation is designed to be carried out by using two bit lines BL1 and BL2. The reading operation is carried out by using the bit line BL2 or bit line BL3. When, in a memory cell with such configuration, the voltage information memorized in the bistable circuit 9 is to be delivered simultaneously via the transfer gates 15 and 17 to the respective bit lines BL2 and BL3, if the bit lines BL2 and BL3 are in a high level state (for instance, 5 V) and the potential at the point A of the bistable circuit 9 is in a low level state (for instance, 0 V), then the currents flow to the point A from both bit lines BL2 and BL3, raising the potential of the point A. Because of this, in the worst situation, the inverter circuit would carry out an inverting operation to bring the potential of the point B to a low level state and the potential of the point A to a high level state, there is a fear of having a case in which the voltage information memorized in the bistable circuit 9 is rewritten.

Further, in delivering the voltage information memorized in the bistable circuit 9 simultaneously to the two bit lines BL2 and BL3, load on the inverter circuit 23 will be doubled compared with the case of delivering it using either one of the bit lines. Consequently, there will be generated a problem that the reading time will become increased.

SUMMARY OF THE INVENTION

An object of the present invention, with the above in mind, is to provide a memory cell which can carry out a stable and accurate memory operation in the multi-port system, without making the configuration large in size.

In order to achieve the above object, the present invention includes a memory means for memorizing a binary information in a static manner, first delivery means for giving the binary information to a first bit line based on the potential of a first word line. Second delivery means are included for giving the binary information memorized in the memory means to a second bit line based on the potential of a second word line which is different from the first word line, without forming a current path between the memory means and the second bit line which is different from the first bit line.

According to the present invention, binary information stored in the memory means is arranged to be read without forming a current path between the memory means and the bit lines. Therefore, it is possible to provide a memory cell which can give the binary information to a plurality of bit lines stably and accurately, and can also realize a fast access and easy design without making the configuration large in scale.

BRIEF DESCRIPTION OF THE DRAWINGS

These and other objects, features, and advantages of the present invention will be more apparent from the following description of the preferred embodiments taken in conjunction with the accompanying drawings in which.

DESCRIPTION OF THE PREFERRED EMBODIMENTS

Figure 4:
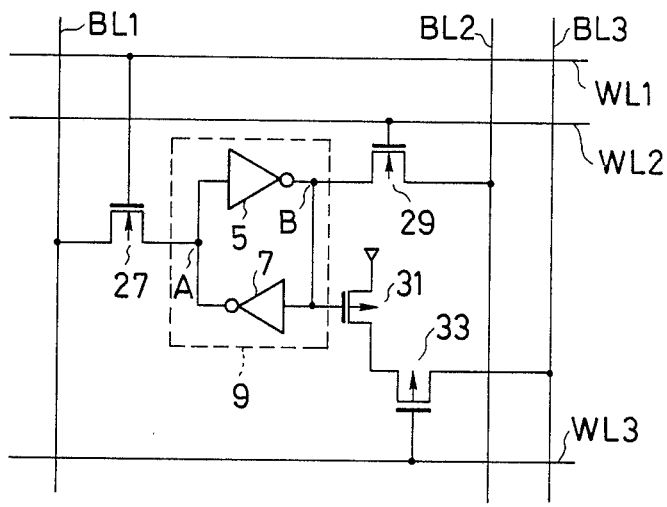
FIG. 4 is a block diagram of the memory cell in accordance with a first embodiment of the present invention.
Figure 5:
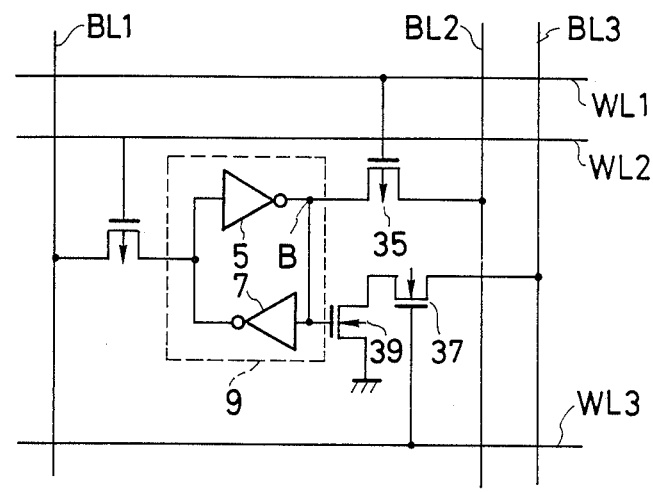
FIG. 5 is a block diagram of the memory cell in accordance with a second embodiment of the present invention.
Figure 6:
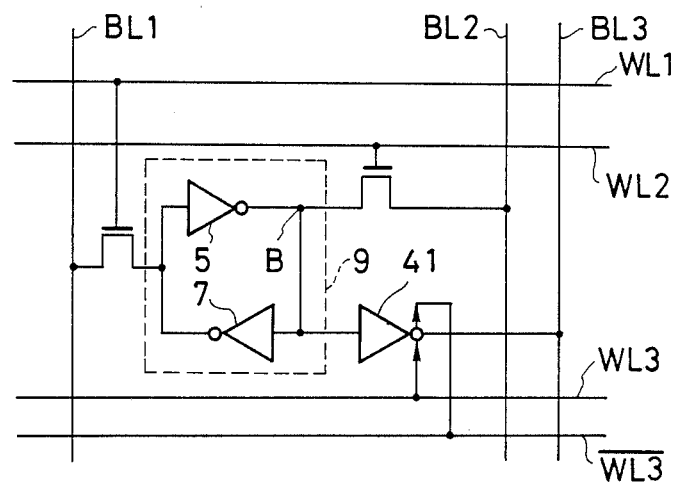
FIG. 6 is a block diagram of the memory cell in accordance with a third embodiment of the present invention.

In FIG. 4 to FIG. 6, there are shown block diagrams of a memory cell for one bit portion in accordance with each of the first to third embodiments of the present invention. Each of the memory cells has 3-port function (it is possible to have 3-port reading during reading cycle, and 1-port writing and 1-port reading during writing cycle) by the use of three bit lines.

Figure 1:
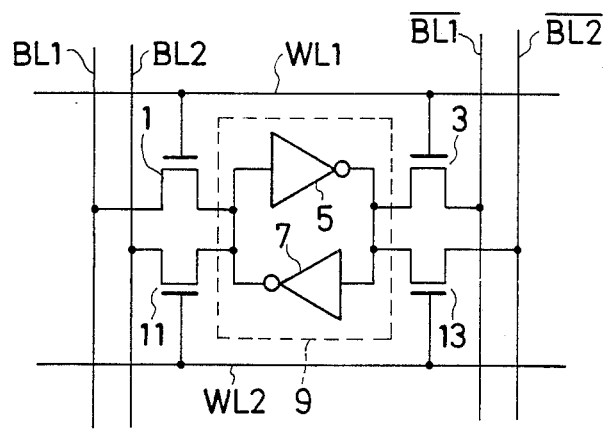
FIG. 1 to FIG. 3 are block diagrams that show the conventional examples of the memory cell.
Figure 2:
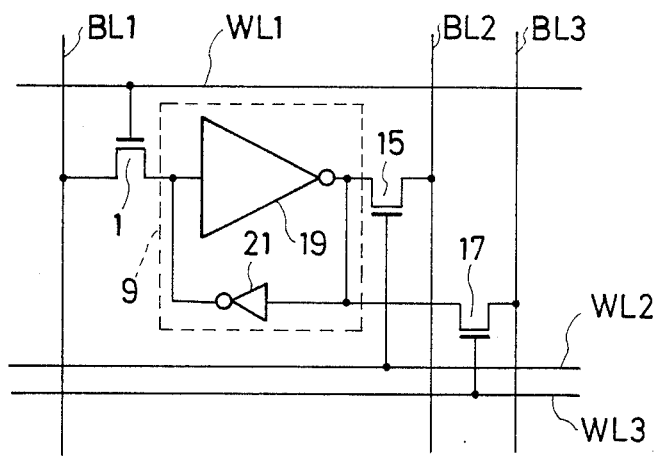

In the memory cell shown in FIG. 4, the bistable circuit 9 is composed of inverter circuits 5 and 7, with their input-output terminals mutually connected similarly to the memory cell shown in FIG. 1. In the bistable circuit 9, the input-output terminal A is connected to the bit line BL1 via an N-channel MOS-type transistor (abbreviated as "NMOS" hereinafter) 27 whose gate terminal is connected to the word line WL1, and the input-output terminal B is connected to the bit line BL2 via an NMOS 29 whose gate terminal is connected to the word line WL2.

Further, the input-output terminal B of the bistable circuit 9 is connected to the gate terminal of a P-channel MOS-type transistor (abbreviated as "PMOS" hereinafter) 31. The PMOS 31 has its source terminal connected to a voltage source and its drain terminal connected to the source terminal of the PMOS 33. The PMOS 33 has its gate terminal connected to the word line WL3 and its drain terminal connected to the bit line BL3 which is used only for reading the voltage information.

Next, the write operation and the read operation of the memory cell with the above configuration will be described.

First, in the writing operation, the NMOS's 27 and 29 are turned on by pulling up the potentials of the word lines WL1 and WL2 to high level. Then, voltage information is given to the bit line BL1, and at the same time, an inverted voltage information with the logic level which is opposite to the voltage information is given to the bit line BL2. Accordingly, the voltage information is input via the NMOS 27 to the input-output terminal A of the bistable circuit 9, and the inverted voltage information is given via the NMOS 29 to the bistable circuit 9. In this way, the voltage information and the inverted voltage information are written into the bistable circuit 9 to be memorized there.

In other words, in the writing operation, voltage information is written differentially into the bistable circuit 9 by the use of two bit lines BL1 and BL2. Accordingly, voltage information can be written with stability and accuracy without making the inverters 5 and 7, which constitute the bistable circuit 9, asymmetrical.

Next, the reading operation will be described. In the memory cell shown in FIG. 1, a voltage information of the input-output of the bistable circuit 9 is delivered to the bit lines BL1 and BL3 to be read, and an inverted voltage information, with a logic level which is reverse that of the voltage information, is delivered to the bit line BL2 to be read.

Prior to the start of the reading operation, the bit lines BL1 and BL2 are pre-charged to a high level state (for instance, 5 V) and the bit line BL3 is pre-discharged to a low level state (for instance, 0 V) in advance. In these states, when the input-output terminal B of the bistable circuit 9 is in a low level state, a current flows from the bit line BL2 to the input-output terminal B via the NMOS 29. The NMOS 29 is turned on by bringing the word line WL2 to a high level state and turning on the PMOS 33 by bringing the word line WL3 to a low level state. As a result, the bit line BL2 becomes a low level state and the voltage information, written in the input-output terminal B of the bistable circuit 9, is read by the output circuit (not shown) connected to the bit line BL2.

Moreover, since the input-output terminal B is in a low level state, the PMOS 31 is turned on and a current flows in the bit line BL3 via the PMOS 31 and PMOS 33. Because of this, the bit line BL3 becomes a high level state, and an inverted voltage information, which has a logic level that is the reverse that of the voltage information written in the input-output terminal B, is read from an output circuit (not shown) that is connected to the bit line BL3.

When the input-output terminal B of the bistable circuit 9 is in a high level state, the PMOS 31 is turned off. It follows that the voltage information of the bit line BL2, which is pre-charged in advance to a high level state, and the voltage information of the bit line BL3, which is pre-discharged to a low level state, are read.

In this way, when the low level voltage information is read from the input-output terminal B in the memory cell shown in FIG. 4, a current path is formed via the NMOS 29 between the input-output terminal B and the bit line BL2. Thus, the low level voltage information is read via the bit line BL2. On the other hand, the low level information is received by the gate terminal of the PMOS 31. By letting a current flow in the bit line BL3 via the PMOS 33 from the voltage source through turning on of the PMOS 31, the high level voltage information is read via the bit line BL3, without forming a current path between the input-output terminal B and the bit line BL3.

Because of this, even when the potential of the input-output terminal B is raised slightly due to flow of a current from the bit line BL2 to the input-output terminal B, the gate potential of the PMOS 31 will not be raised beyond the threshold voltage. The threshold voltage of the PMOS is ordinarily set to a potential which is in the vicinity of the power supply potential. Therefore, in sending out a low level voltage information to the bit line BL3, the PMOS 31 will never be turned off. Accordingly, even when the low level voltage information that is written in the input-output terminal B is simultaneously read via the bit lines BL2 and BL3, respectively, there will be no fear of having malfunctions.

Figure 3:
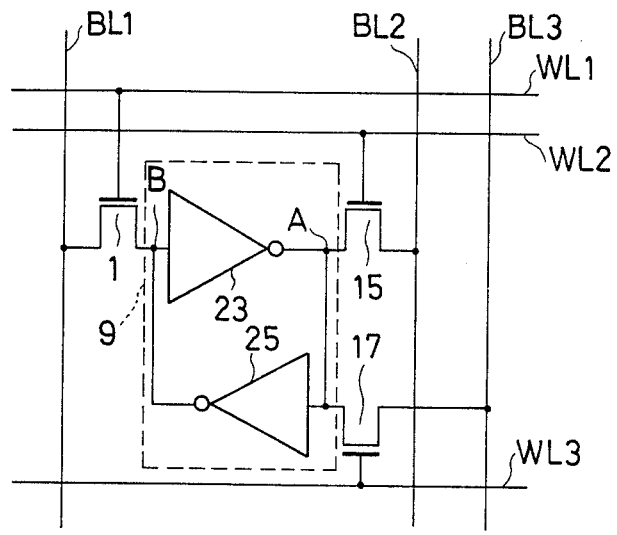

Further, in delivering simultaneously voltage information from the input-output terminal B to the bit lines BL2 and BL3, load on the inverter circuit 5 comprises the single bit line BL1 and the gate capacity of the PMOS 31. Consequently, the load to the inverter circuit 5 will be reduced considerably compared with the memory cell shown in FIG. 3. Therefore, it is possible to perform the operation of reading voltage information in the bit lines BL2 and BL3, without making the inverter circuit 5 large in size.

In FIG. 5 a block diagram is shown for one bit portion of the memory cell in accordance with a second embodiment of the present invention. Similar to the memory cell shown in FIG. 4, this memory cell reads the voltage information written in the input-output terminal B of the bistable circuit 9 via the bit line BL2. Also, voltage information with a logic level inverse to that of the above voltage information via the bit line BL3.

A feature of the memory cell is to read voltage information written in the input-output terminal B from the bit line BL2, which is pre-discharged to a low level state in advance, via the PMOS 35 whose conduction is controlled by the word line WL1.

Further, another feature is that high level voltage information and low level voltage information, with logic level opposite to which of the high level voltage information, that are written in the input-output terminal B, are read via the bit line BL3. This is done by turning on an NMOS 39 whose source line is grounded, and by passing a current to the ground, via NMOS's 37 and 39, from the bit line BL3 which is pre-discharged in advance to a high level state. Here, the drain terminal of the NMOS 39 is connected to the source terminal of the NMOS 37, whose conduction is controlled by the potential of the word line WL3 and whose drain terminal is connected to the bit line BL3. In other words, voltage information is arranged to be delivered from the input-output terminal B to the bit line BL3 without forming a current path between the input-output terminal B of the bistable circuit 9 and the bit line BL3.

Accordingly, with a configuration as described above, it is possible to obtain effects similar to those of the first embodiment. In the above, components that are identical to those in FIG. 4 were given the same symbol and their descriptions were omitted.

In FIG. 6 a block diagram is shown for one bit portion of the memory cell in accordance with a third embodiment of the present invention. The memory cell carries out writing and reading operations analogous to the memory cells shown in FIG. 4 and FIG. 5. A feature of the memory cell is that the voltage information which has a logic level opposite to that of the voltage information written in the input-output terminal B of the bistable circuit 9, is read by being given to the bit line BL3 via a clocked inverter circuit 41. The clocked inverter circuit 41 is configured so that its operation is controlled by the potential of the word line WL3, the input terminal is connected to the input-output terminal B of the bistable circuit 9, and the output terminal is connected to the bit line BL3.

With such a configuration, it is possible to obtain effects similar to those of the first embodiment. In addition, it is also possible, depending upon the requirement for the system, to have an irregular operation in which the bit lines BL1 and BL2 are operated as synchronous while the bit line BL3 is operated as asynchronous. It should also be noted that components with identical symbols indicate items that are the same as those in FIG. 4 and that their descriptions are omitted. In addition, it should be noted that similar effects as described above can also be obtained from a configuration in which the voltage information at the point B is input to an inverter and gives the output of the inverter to the bit line via a transfer gate, in place of the use of the clocked inverter.

When the present invention has a multi-port function, the effects of the present invention can be obtained by providing a memory cell accessible to a word designated independently and simultaneously with respect to the respective ports.

What is claimed is:

1. A memory cell comprising:
   memory means for memorizing binary information in a static manner;
   first delivery means for giving the binary information to first and second bit lines respectively, based on potentials of first and second word lines; and
   second delivery means for giving the binary information memorized in said memory means to a third bit line different from the first and second bit lines, based on the potential of a third word line different from the first and second word lines, without forming a current path between said memory means and the third bit line.

2. The memory cell as claimed in claim 1 wherein said memory means is a bistable circuit equipped with an inverter circuit whose input-output terminals are connected to each other.

3. The memory cell as claimed in claim 1 wherein said first delivery means comprises a first P-channel MOS-type transistor, and said second delivery means comprises a second N-channel MOS-type transistor inverted between a ground and a bit line pre-charged to a high level.

4. The memory cell as claimed in claim 1 wherein said first delivery means comprises a first N-channel MOS transistor, and said second delivery means comprises a second P-channel MOS-type transistor inserted between a voltage source and a bit line pre-charged to a low level state.

5. The memory cell as claimed in claim 1 wherein said second delivery means comprises a clocked inverter circuit.

6. The memory cell as claimed in claim 3 wherein a bistable circuit as the memory means comprises two symmetric inverter circuits, each having input-output terminals, in which an input terminal of one of the inverter circuits is connected mutually to an output terminal of the other inverter circuit.

7. The memory cell as claimed in claim 6 wherein one of the input-output terminals of the inverter circuits is connected to a first N-channel MOS-type transistor that constitutes the first delivery means.

8. The memory cell as claimed in claim 7 wherein the other input-output terminal of the inverter circuits is connected to the second N-channel MOS-type transistor that constitutes the second delivery means.

9. The memory cell as claimed in claim 8 wherein the other input-output terminal of the inverter circuits is connected to the gate terminal of a second P-channel MOS-type transistor that constitutes the second delivery means, and the source-drain terminal of the second P-channel MOS-type transistor is connected to the source-drain terminal of the first P-channel MOS-type transistor.

10. The memory cell as claimed in claim 4 wherein one of an input-output terminals of an inverter circuit used in said memory means is connected to a first P-channel MOS-type transistor that constitutes the first delivery means.

11. The memory cell as claimed in claim 10 wherein the other input-output terminal of the inverter circuit is connected to the second P-channel MOS-type transistor.

12. The memory cell as claimed in claim 11 wherein the other input-output terminal of the inverter circuit is connected to the gate terminal of a second N-channel MOS-type transistor that constitutes the second delivery means, and the source-drain terminal of the second N-channel MOS-type transistor is connected to the source-drain terminal of the first N-channel MOS-type transistor.

13. The memory cell as claimed in claim 6 wherein one of the input-output terminals of the inverter circuits is connected to the input-output terminal of a clocked inverter circuit that constitutes the second delivery means.

* * * * *